(12) United States Patent
Lukic et al.

(10) Patent No.: US 8,125,287 B2
(45) Date of Patent: Feb. 28, 2012

(54) EXTENDABLE N-CHANNEL DIGITAL PULSE-WIDTH/PULSE-FREQUENCY MODULATOR

(75) Inventors: Zdravko Lukic, Toronto (CA); Eric Iozsef, Toronto (CA); Zhenyu Zhao, Burlington (CA); Jingquan Chen, San Jose (CA)

(73) Assignee: EXAR Corporation

( * ) Notice: Subject to any disclaimer, the term of this patent is extended or adjusted under 35 U.S.C. 154(b) by 157 days.

(21) Appl. No.: 12/707,895

(22) Filed: Feb. 18, 2010

(65) Prior Publication Data

US 2011/0199164 A1 Aug. 18, 2011

(51) Int. Cl.
*H03K 7/08* (2006.01)
*H03K 7/06* (2006.01)
*H03K 3/017* (2006.01)

(52) U.S. Cl. ........ 332/109; 332/112; 332/119; 327/172; 327/176; 375/238; 375/239

(58) Field of Classification Search .......... 332/109–114, 332/119; 327/172–176; 341/53; 363/21.1, 363/21.11, 41; 370/212, 213; 375/238, 239
See application file for complete search history.

(56) References Cited

U.S. PATENT DOCUMENTS

| | | | | |
|---|---|---|---|---|
| 6,154,015 A | * | 11/2000 | Ichiba | 323/225 |
| 6,424,197 B1 | | 7/2002 | Salcedo et al. | |
| 6,912,139 B2 | | 6/2005 | Kernahan et al. | |
| 7,365,661 B2 | | 4/2008 | Thomas | |
| 7,446,513 B2 | * | 11/2008 | Dikken et al. | 323/271 |
| 7,579,820 B2 | * | 8/2009 | Hane | 323/288 |
| 7,609,039 B2 | * | 10/2009 | Hasegawa | 323/273 |
| 7,629,782 B2 | * | 12/2009 | Naka | 323/271 |
| 7,705,648 B1 | * | 4/2010 | Fung | 327/175 |
| 7,994,769 B2 | * | 8/2011 | Ohtake et al. | 323/283 |
| 2006/0055574 A1 | | 3/2006 | Maksimovic et al. | |
| 2006/0214712 A1 | | 9/2006 | O'Malley et al. | |
| 2007/0170897 A1 | | 7/2007 | Williams | |
| 2008/0204160 A1 | * | 8/2008 | Prodic et al. | 332/109 |
| 2008/0204290 A1 | | 8/2008 | Parayandeh et al. | |
| 2009/0027021 A1 | | 1/2009 | Dequina | |

OTHER PUBLICATIONS

International Searching Authority, "International Search Report and Written Opinion", Apr. 21, 2011, 8 pages.

* cited by examiner

*Primary Examiner* — Levi Gannon
(74) *Attorney, Agent, or Firm* — Fliesler Meyer LLP (57) ABSTRACT

A multichannel digital pulse width modulator/digital pulse frequency modulator uses a single ring oscillator that is shared by multiple channels. The ring oscillator has taps that can be used for least significant bit (LSB) precision of the generated PWM signal. The ring oscillator also produces a ring clock that is used to synchronize logic in the channels. Since the logic in the channels are synchronized by the ring clock, the channels can each independently produce different frequency PWM (or PFM) signals and still share the same ring oscillator.

18 Claims, 13 Drawing Sheets

EXTENDABLE N-CHANNEL DIGITAL PULSE-WIDTH/PULSE-FREQUENCY MODULATOR

FIELD OF THE INVENTION

The present invention relates to digital pulse width modulators (DPWM) and digital pulse frequency modulators (DPFM).

BACKGROUND

Digital pulse width modulators are circuits to produce pulse width modulation (PWM) signals. Digital pulse frequency modulators are circuits to produce pulse frequency modulation (PFM) signals. For PWM signals, the widths of the pulses are varied at constant frequency. For PFM signals, fixed-duration pulses are sent at varying frequencies. Both PWM and PFM signals are used to produce DC power output voltages.

The PWM and PFM signals are used to control external switches to input a power voltage and ground into an external LC circuit comprised of an inductor and an output capacitor. The greater the PWM (or PFM) signal duty cycle (fraction of time high), the greater the DC output voltage.

The PWM (or PFM) signal is typically fed into an external deadtime circuit that produces a high side (HS) PWM (or PFM) signal for a high side switch and a low side (LS) PWM (or PFM) signal for a low side switch. The external deadtime circuit can insert a deadtime where neither the high side nor the low side PWM (or PFM) signal is high to prevent both the high side and the low side switches from being on at the same time.

SUMMARY OF THE INVENTION

A multichannel digital pulse width modulator/digital pulse frequency modulator uses a single ring oscillator that is shared by multiple channels. The ring oscillator has taps used for least significant bit (LSB) precision of the generated PWM signal. The ring oscillator also produces a ring clock that is used to synchronize logic in the channels. Since the logic in the channels is synchronized by the ring clock, the channels can each independently produce different frequency PWM and PFM signals and still share the same ring oscillator.

Sharing a ring oscillator greatly reduces the power consumption of the multichannel DPWM/DPFM. Power consumption can be further reduced by triggering logic in the channels on both the rising and falling edge of the taps of the ring oscillator. By triggering on both the rising and falling edges, the number of delay cells in the ring oscillator (and thus the ring oscillator's power consumption) can be cut in half.

The high side and low side PWM and PFM signals are generated within the channel with independently selectable deadtimes so as to not require an external deadtime circuit.

The channels share logic, such as counters and finite state machine (FSM) logic, for the generation of both the pulse width modulation signals and pulse frequency modulation signals.

The present invention can be used in various applications that require either digitally controlled high-resolution pulse-width or pulse-frequency modulated signals whose switching frequency and phase relationship can be digitally programmed. Such applications include, but are not limited to, digital controller circuits regulating the operation of switch-mode power supplies.

DETAILED DESCRIPTION OF THE INVENTION

Figure 1A:
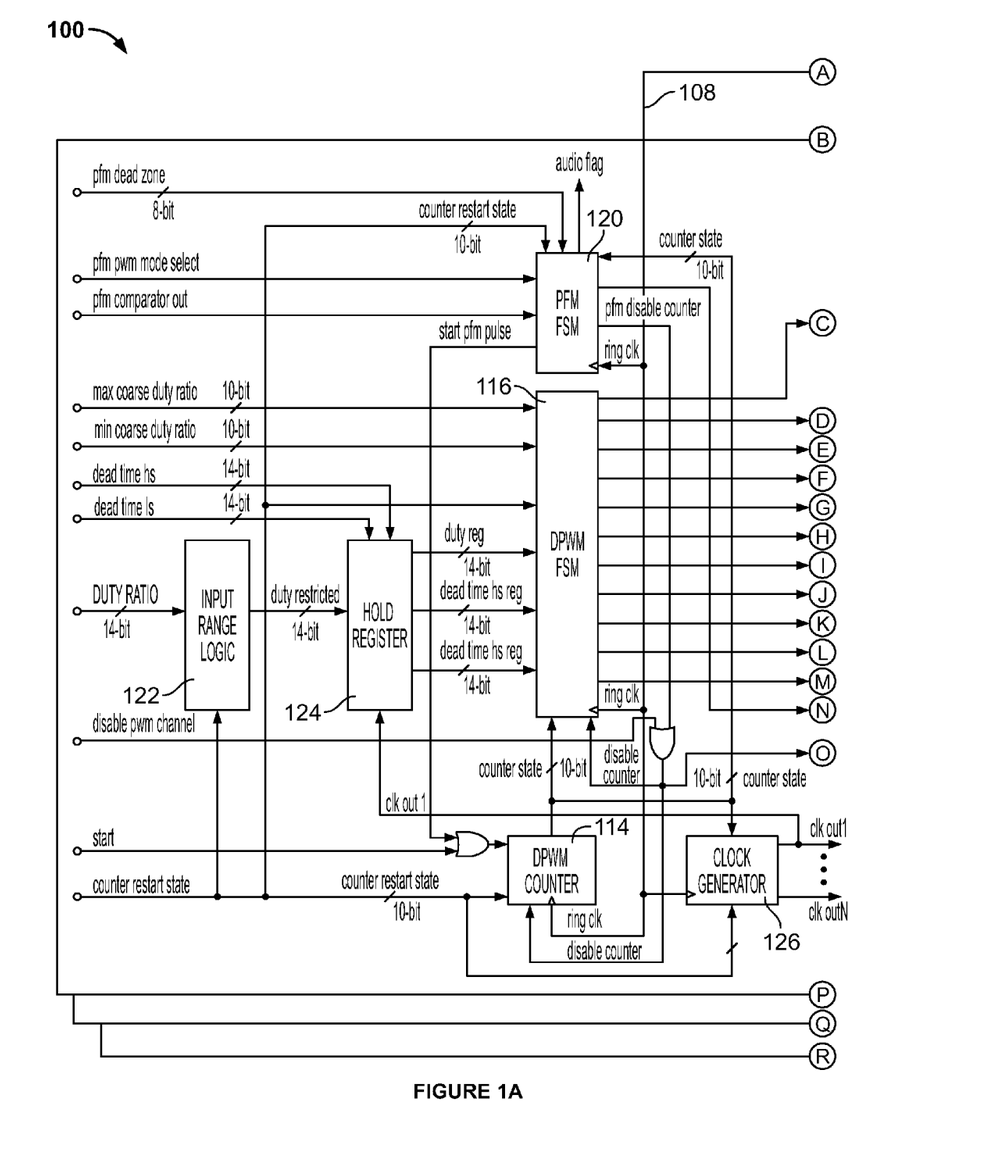
FIG. 1 shows an example of an architecture of a scalable N-channel digital pulse-width/pulse-frequency modulator with a ring oscillator.
Figure 1B:
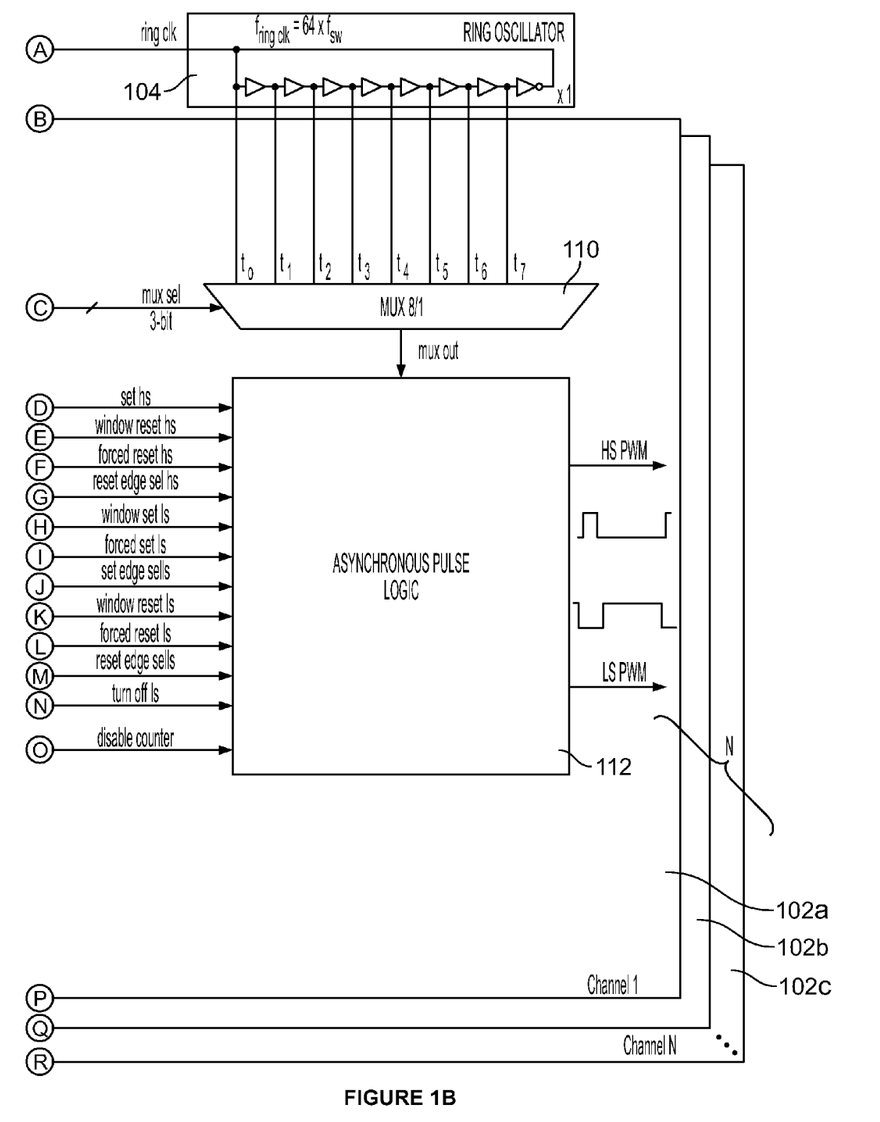

FIG. 1 shows a multichannel digital pulse width modulator/digital pulse frequency modulator 100. Multiple channels 102a, 102b and 102c, produce multiple PWM (or PFM) signals.

A single ring oscillator 104 is shared by the multiple channels 102a, 102b and 102c, the ring oscillator 104 is used to synchronize the multiple channels 102a, 102b and 102c. The single ring oscillator 104 has taps $t_0$-$t_7$ that are used to provide for least significant bit (LSB) resolution for the PWM signals created by the multiple channels 102a, 102b, and 102c.

The ring oscillator 104 synchronizes the multiple channels using a ring clock on line 108. The ring oscillator taps $t_0$-$t_7$, go into multiplexer 110 that select a signal for pulse logic 112. The pulse logic 112 is selectable to be triggered on the rising or falling edge of the selected signal from the multiplexer 110.

The multiple channels 102a, 102b and 102c produces both a high side and a low side PWM (or PFM) signal, rather than using an external deadtime circuit. The multiple channels 102a, 102b and 102c produce the high side and low side signals such that there is deadtime when neither the high side nor the low side PWM (or PFM) signal is high to prevent high side and low side switches from being on the same time. Producing the high side and low side PWM (or PFM) signals in the channel prevents the need for an external deadtime circuit.

The deadtimes at the rising and falling edge of the high side PWM (or PFM) signal are independently selectable, which is advantageous since the high side and low side switch have different operating characteristics.

Each of the channels has logic, such as a counter 114, clock generator 126 and DPWM FSM 116, that is used for both pulse width modulation signal generation and pulse frequency modulation signal generation.

The multiple channels check whether a pulse frequency modulated signal is has a frequency that is too high or too low. If the frequency is too high or too low, the frequency and pulse width of the PFM signal can be changed. If the frequency of the PFM signal is too low in an audio range, an audio flag can be raised and the frequency increased to prevent audible hums. The channels also check for a dead zone to ensure that the pulse frequency modulated signal does not have too high of a frequency.

The design of FIG. 1 is an extendable N-channel high-resolution digital pulse-width/pulse-frequency modulator 100. The design is compatible with additional or fewer channels, as needed. For each of its N channels, the modulator has two distinctive modes of operation: pulse-width and pulse-frequency mode. The desired mode of operation can be externally selected and changed "on the fly" during operation.

In the pulse-width mode, the modulator 100 can be used to produce two high-resolution non-overlapping pulse-width modulated signals per channel. The duration of non-overlapping time periods, when both signals are turned off, is digitally programmable. As a result, the new modulator 100 eliminates the need for N external dead-time circuits. The switching frequency of all pulse-width modulated signals is externally adjustable. Its value can be selected with a very fine step from a wide frequency range and for each channel independently.

In the pulse-frequency mode, the frequency of the output signals is controlled by an external digital input. The pulse on-time is also adjustable with high resolution. The modulator 100 detects and flags when the frequency of the output signals falls into the audible range. As a result, the generation of undesirable audible noise can be prevented. In the same mode, an adjustable time interval ("dead zone") is inserted between two consecutive pulse-frequency pulses. As a result, it is guaranteed that the maximum achievable pulse frequency is always lower than the frequency specified for the pulse-width mode. This feature can be used to prevent the switching converter from operating with lower efficiency under certain load conditions.

The modulator architecture minimizes required hardware resources and it is fully extendable. The number (N) of modulator channels can be either increased or decreased by means of paralleling the channels. A simple one-time synchronization scheme between modulator channels is provided which minimizes noise cross-coupling effects. As a result, the modulator 100 can be utilized in various practical applications, for example to produce control signals regulating an arbitrary number of switching converter phases in switch-mode power supplies.

The architecture of the N-channel digital pulse-width/pulse-frequency modulator 100 is shown in FIG. 1. To obtain high-frequency operation of the modulator as well as high resolution, a ring oscillator 104 is utilized as a clock source. The ring oscillator 104 generates the high-frequency clock signal ring clk and eight equally phase-shifted variants $t_0$, $t_1$, ..., $t_7$. To minimize hardware complexity, power consumption, and silicon area, the ring oscillator is shared among all modulator channels. The ring oscillator 104 includes eight identical delay cells with an equal signal propagation delay $t_{pd}$. The equal propagation delay $t_{pd}$ of all delay cells is achieved by virtue of matching.

The modulator, shown in FIG. 1, produces two high-resolution pulse-width/pulse-frequency signals, HS PWM and LS PWM, with adjustable switching frequency and resolution for each channel. The state of the DPWM counter 114, shown in FIG. 1, is incremented by the DPWM finite-state machine (FSM) 116 between zero and the value specified by input counter restart state. Each time the counter 114 reaches zero value, a high-side PWM signal is set to high by the DPWM FSM 116 in the PWM mode. Therefore, the selected value of counter restart state is used to program the switching frequency of each modulator channel independently according to:

$$f_{sw} = \frac{1}{(\text{counter restart state} + 1) \cdot T_{ring\ clk}}, \quad (1)$$

where $T_{ring\ clk}$ is the ring oscillator clock period.

The duty-ratio/pulse on-time resolution of HS PWM and LS PWM is often required to be smaller than the ring oscillator period $T_{ring\ clk}$. For the modulator from FIG. 1, the initial resolution, defined by the size of the counter restart state, is improved by 16 times with only eight equally phase-shifted clock signals $t_0$, $t_1$, ..., $t_7$. This is achieved by using both signal edges of the clock signals to set/reset modulator output signals. The utilization of both edges halves the number of delay cells needed as well as the size of the multiplexer performing the desired selection between ring clock signals. The phase-shifted clock signals are tapped with a single 8/1 multiplexer 110 and fed to the block called asynchronous pulse logic 112. In combination with the DPWM FSM 116, this block provides additional precise duty ratio/pulse on-time adjustments that cannot be achieved by the DPWM counter 114 on its own. Therefore equivalent modulator resolution, for each modulator channel from FIG. 1, is expressed in terms of bits as:

$$N_{res} = 4 + \log_2(\text{counter restart state} + 1). \quad (2)$$

The asynchronous pulse logic block 112 also directly generates non-overlapping periods $T_{hs}$ and $T_{ls}$ (referred to in literature as "dead times") between high side (HS) PWM and low side (LS) PWM signals. As a result, the modulator 100 eliminates N external dead-time circuits required in switch-mode power supply applications. To minimize hardware resources, it shares the 8/1 multiplexer to modulate three signal edges of HS PWM and LS PWM. Both dead-time periods $T_{hs}$ and $T_{ls}$ are accurately controlled. They are specified with two inputs, dead time hs and dead time ls, for each channel independently according to:

$$T_{hs} = \text{dead time } hs \cdot t_{pd}, \quad (3)$$

$$T_{ls} = \text{dead time } ls \cdot t_{pd}, \quad (4)$$

where $t_{pd}$ is the delay cell propagation time. Since the multiplexer 110 sets and resets both modulator output signals, the minimum value of both periods $T_{hs}$ and $T_{ls}$ is limited to $T_{ring\ clk}$.

The modulator 100 from FIG. 1 is capable of providing pulse-frequency modulated signals for each channel due to the operation of PFM FSM block 120. When enabled with pfm pwm mode select input, the PFM FSM block 120 modifies the operation of the DPWM FSM such that the output signals pulsate only when triggered by pfm comparator out.

The modulator channels, shown in FIG. 1, also contain additional blocks: input range logic 122, hold register 124, and clock generator 126. The input range logic 122 limits the maximum duty ratio value applied to the modulator 100 based on the selected counter restart state, while the hold register 124 keeps the duty ratio command and the dead-time values constant during a switching cycle. Finally, the clock generator 126 provides clock signals that are always synchronized with the switching signals of the modulator channel for external blocks governing the modulator operation.

Figure 2A:
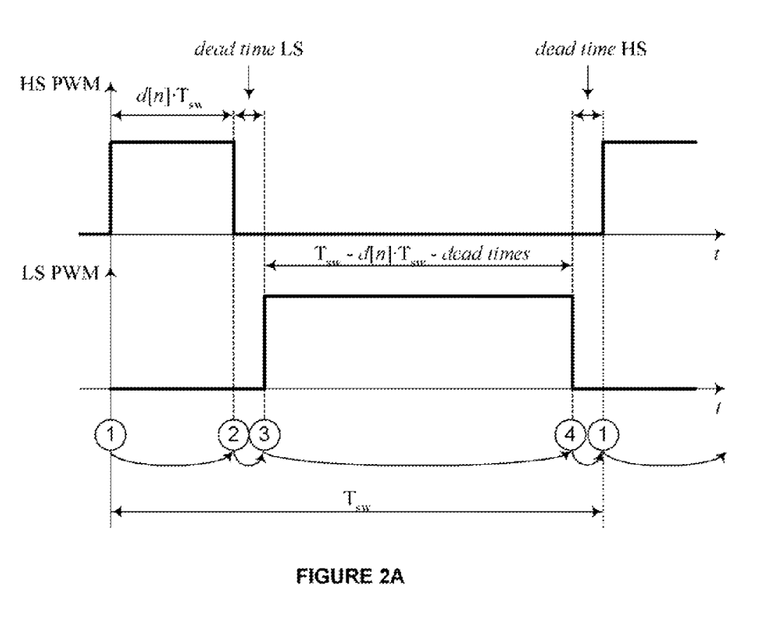
FIG. 2A shows exemplary output pulse-width modulated waveforms generated in PWM mode.
Figure 2B:
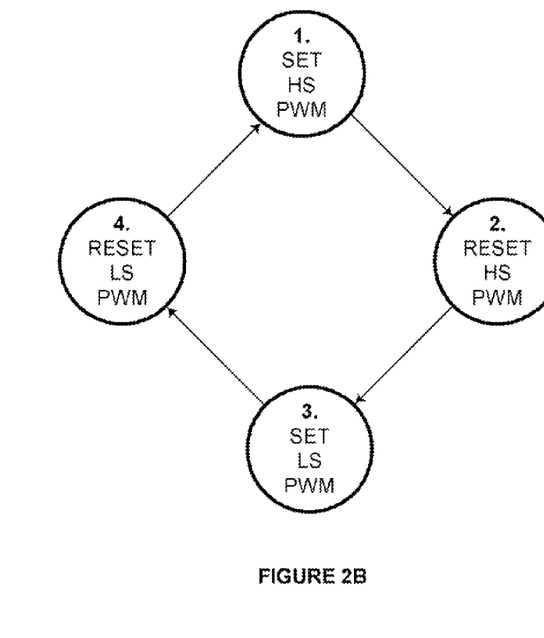
FIG. 2B shows a state diagram of an exemplary DPWM Finite-State Machine (FSM).

When the modulator channel is selected to operate in the pulse-width mode (pfm pwm mode select=0), it produces output signals as illustrated in FIG. 2A. To provide constant switching frequency of HS PWM and LS PWM and modulate three signal edges (labeled as 2, 3, and 4 on FIG. 2A) the DPWM FSM 116 monitors the state of the DPWM counter 114. Based on the counter state, input duty ratio value, and selected dead times, it then appropriately regulates the operation of the asynchronous pulse logic block to set/reset HS PWM and LS PWM. Since all four signal edges appear consecutively, one after the other, the DPWM FSM 116 has four dedicated states, shown in FIG. 2B, to generate each edge. The operation of a modulator channel in each state is described below.

Figure 3:
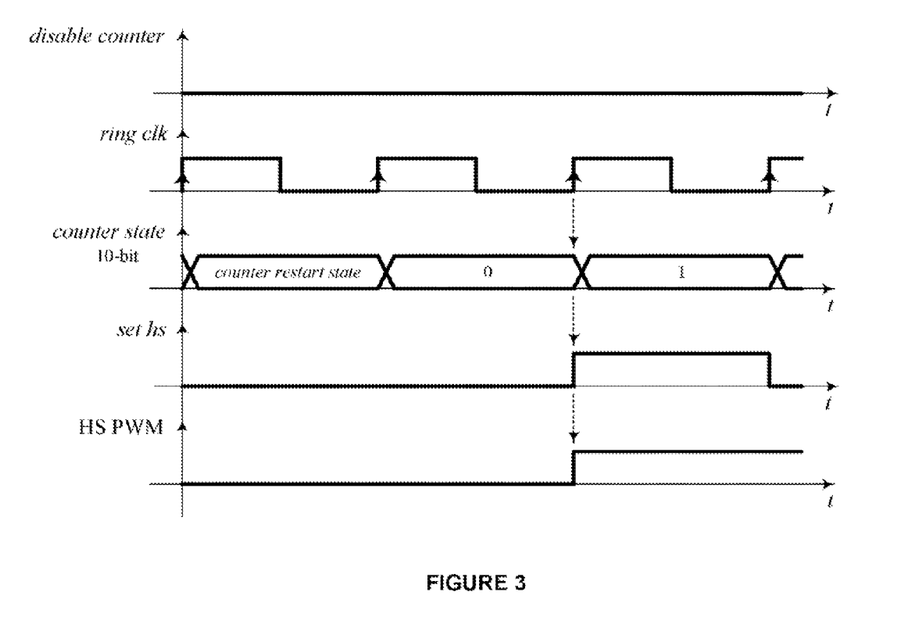
FIG. 3 shows a timing waveform sequence used to set the high-side PWM signal.
Figure 4:
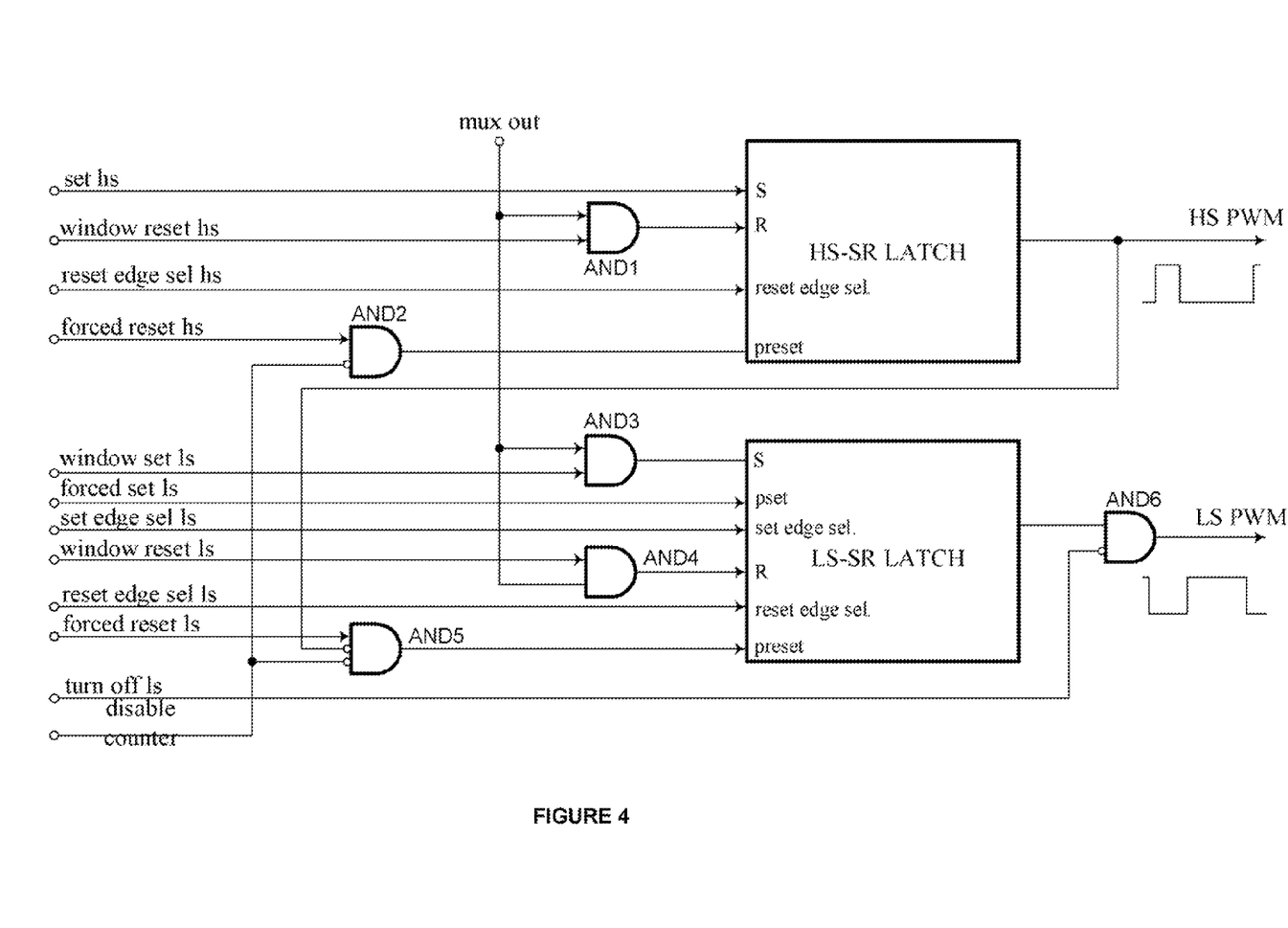
FIG. 4 shows a block diagram of an exemplary asynchronous pulse logic used to produce high-side and low-side switching signals for each modulator channel.
Figure 5:
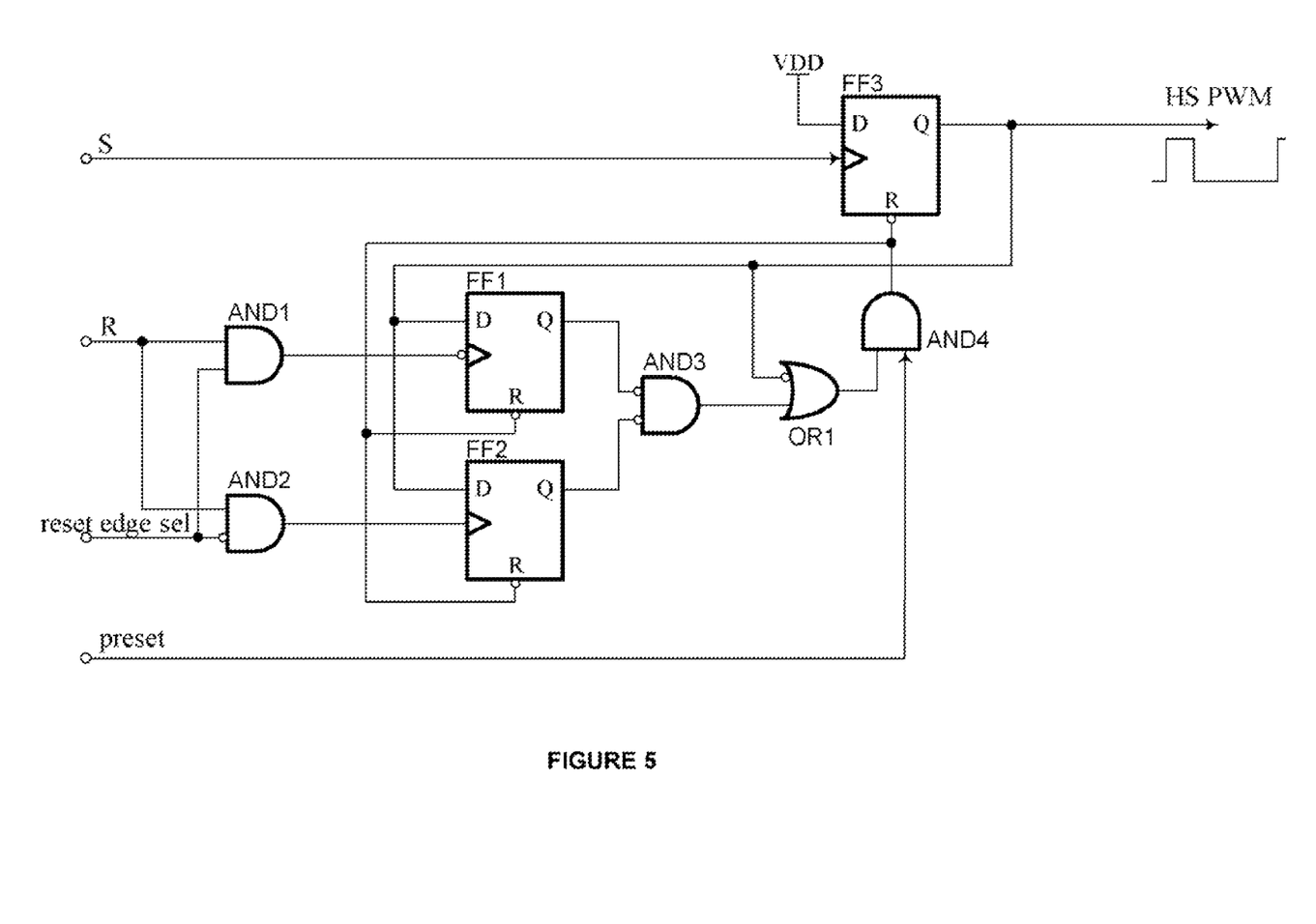
FIG. 5 shows a block diagram of a high-side SR latch.
Figure 6:
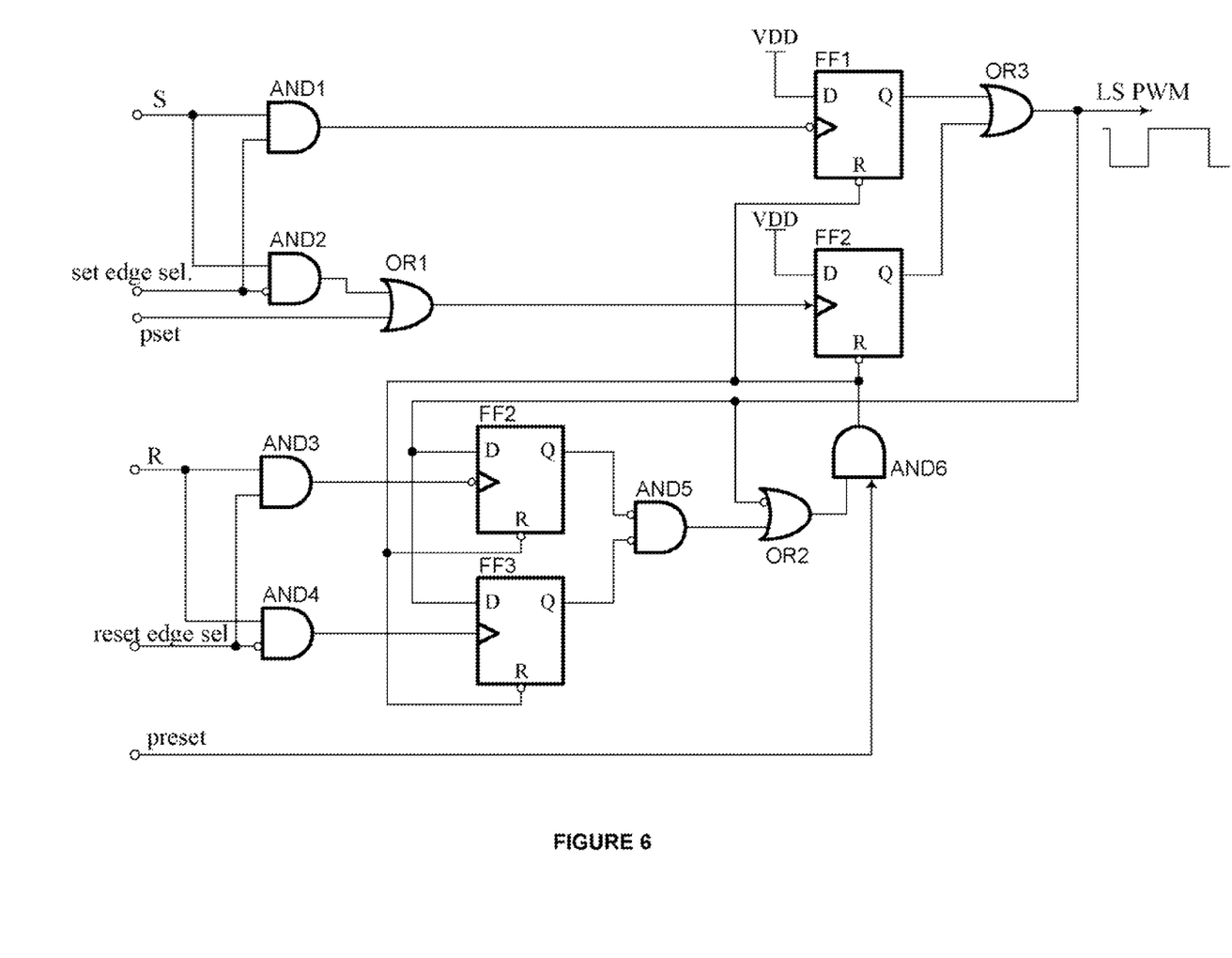
FIG. 6 shows a block diagram of a low-side SR latch.

The rising-edge generation of HS PWM is illustrated in FIG. 3. The DPWM counter is continuously enabled in this mode. Therefore, on each rising edge of ring clk, the counter 114 periodically increments its state until it reaches counter restart state. At this point, the counter resets its state back to zero and repeats the counting sequence. Each time the DPWM FSM 116 detects the zero counter state, it sets the set hs output going into the asynchronous pulse logic high. The circuit implementation of the asynchronous pulse logic is shown in FIG. 4. It primarily consists of two edge-triggered SR latches whose circuit implementations are shown in FIGS. 5 and 6. The rising edge of set hs triggers D-flip flop FF3 in FIG. 5 causing the periodic rising edge of HS PWM as illustrated in FIG. 3. In the next counter cycle, set hs is reset back to zero in order to prepare for the next switching cycle.

Figure 7:
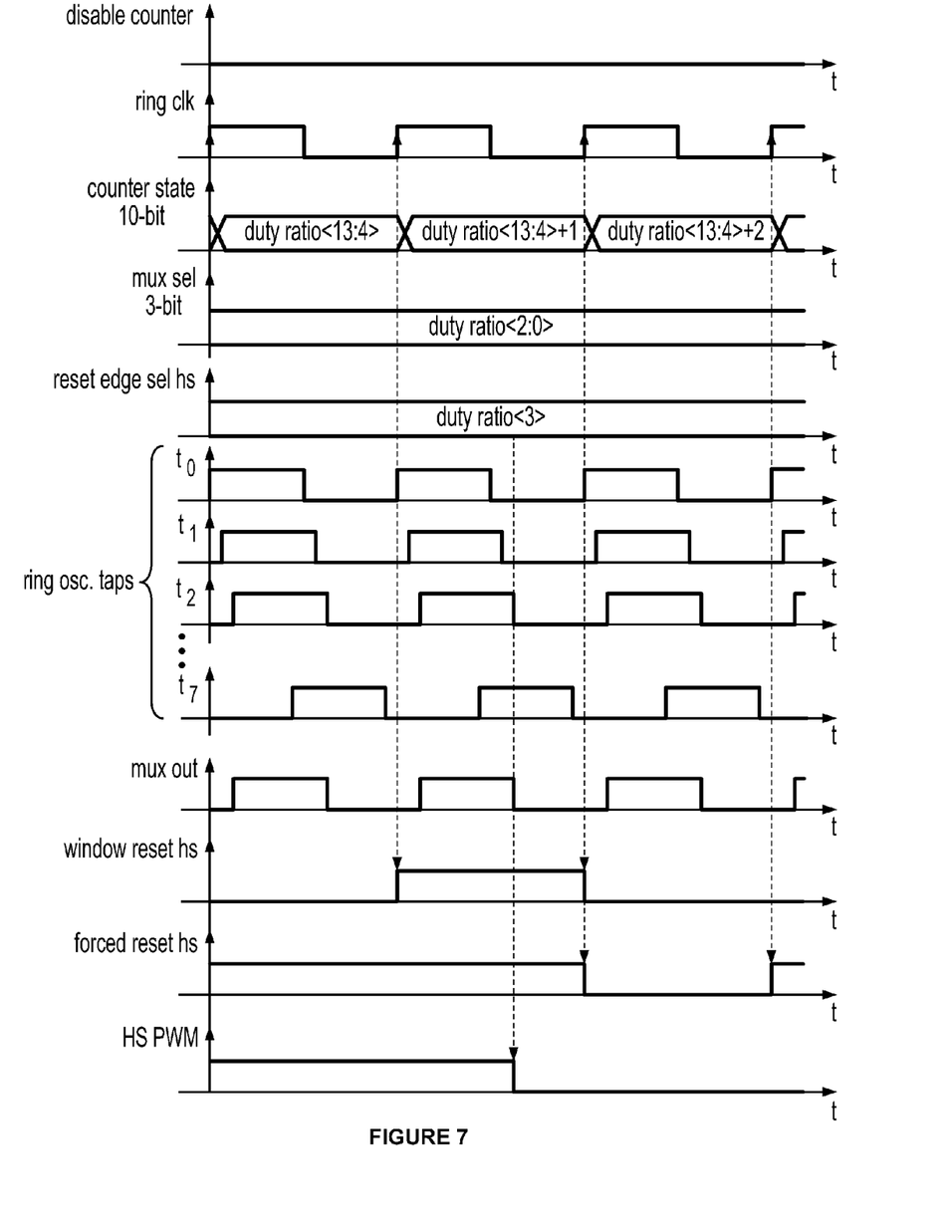
FIG. 7 shows a timing waveform sequence used to reset the high-side PWM signal.

The falling-edge generation of HS PWM is presented in FIG. 7. As showed in FIG. 2A, the time interval between the rising and falling edge is governed by the duty ratio d[n]. Therefore, the DPWM FSM 116 monitors the state of the DPWM counter and compares it with the most significant bits (MSBs) of duty ratio command (excluding the 4 least significant bits). The three remaining bits are then used to control the multiplexer selection bits mux sel, while the fourth bit regulates reset edge sel hs input that determines which edge of the clock is used to reset the HS PWM.

Once the counter state equals MSBs, the DPWM FSM 116 sets window reset hs output. This output opens the and-gate AND1 in the multiplexer output signal path, as shown in FIG. 4, while other gates AND3 and AND4 in the same signal path are closed. In this way, the selected phase-shifted clock signal from the ring oscillator passes through the multiplexer, and it feeds the designated input of HS-SR latch for HS PWM. Depending on the selected clock edge, controlled by reset edge sel hs, the phase-shifted clock sets either negative edge-triggered D-flip flop FF1 or positive-edge FF2, shown in FIG. 5, causing the output flip flop FF3 to reset the latch state. As a result, the falling edge of HS PWM is produced proportionally to the input duty ratio value as shown in FIG. 7. For protection purposes, in the next counter cycle, the DPWM FSM 116 automatically resets the same HS SR latch with forced reset hs output.

Figure 8:
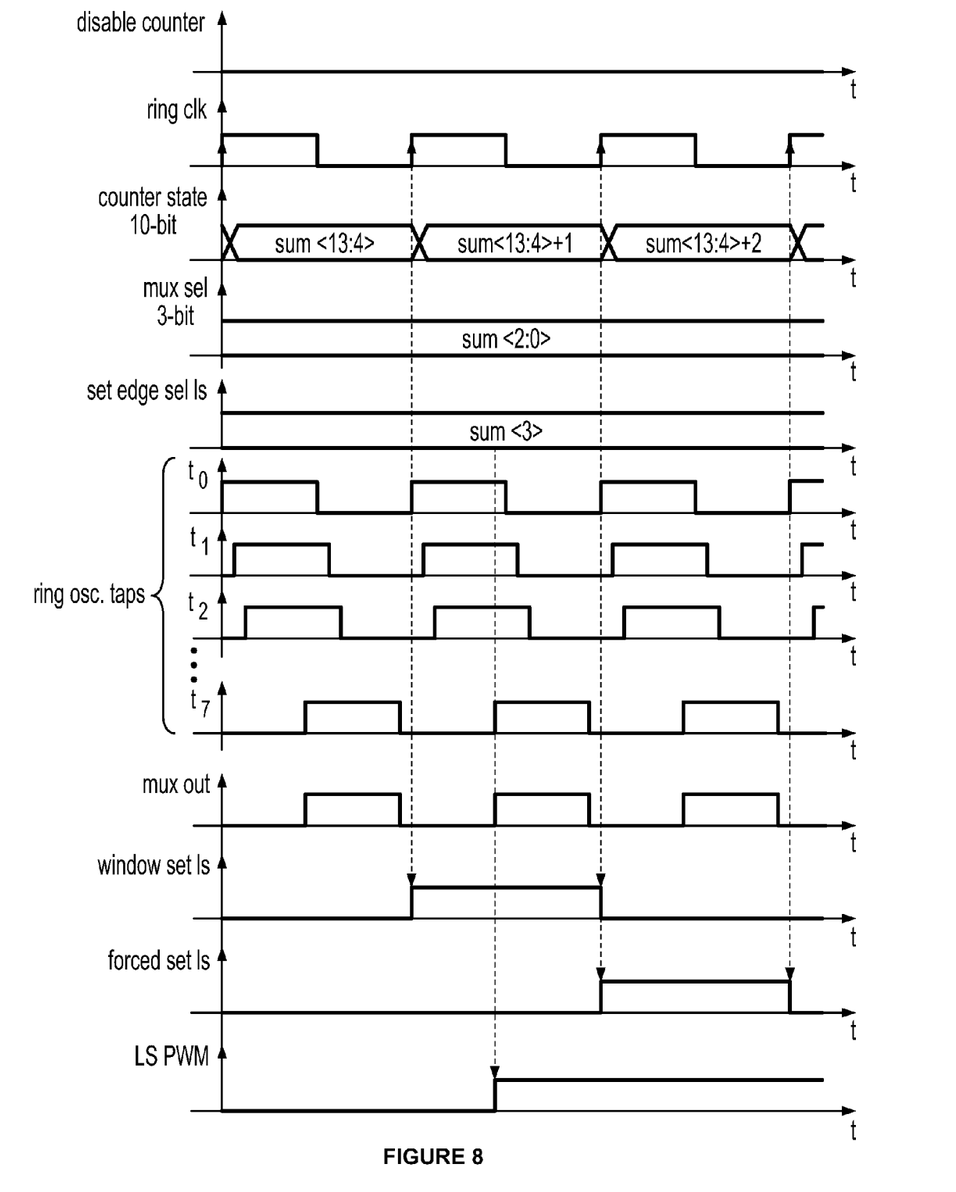
FIG. 8 shows a timing waveform sequence used to set the low-side PWM signal.

The rising-edge generation of LS PWM is shown in FIG. 8. According to FIG. 2A, the rising edge of LS PWM is scheduled to occur after the falling edge of HS DPWM. The DPWM FSM 116 determines the exact set point of LS PWM as a sum of duty ratio value and dead time ls value. In a similar fashion, as described in the section above, the MSBs of this sum are compared to the counter state. The three LSBs of the sum are then used to control the multiplexer selection input. The last remaining bit selects the type of the clock edge that sets the LS-SR latch, shown in FIG. 4 that produces LS PWM.

When the counter state matches the sum MSBs, window set ls output from DPWM FSM 116 opens the signal path for the selected phase-shifted clock signal to pass to the set input of the LS-SR latch. Depending on set edge ls, either positive-edge D-flip flop FF1 or negative edge D-flip flop FF2 is set as shown in FIG. 6. Consequently, the rising edge of LS PWM is produced as depicted in FIG. 8. For protection purposes, to guarantee that the rising edge always occurs, forced set is output is activated in the following switching cycle that automatically sets FF2. Note that, if HS PWM is for some reason still high, the rising-edge generation is disabled through gate AND5, shown in FIG. 4 that keeps LS-SR Latch in the reset state until HS PWM becomes low.

Figure 9:
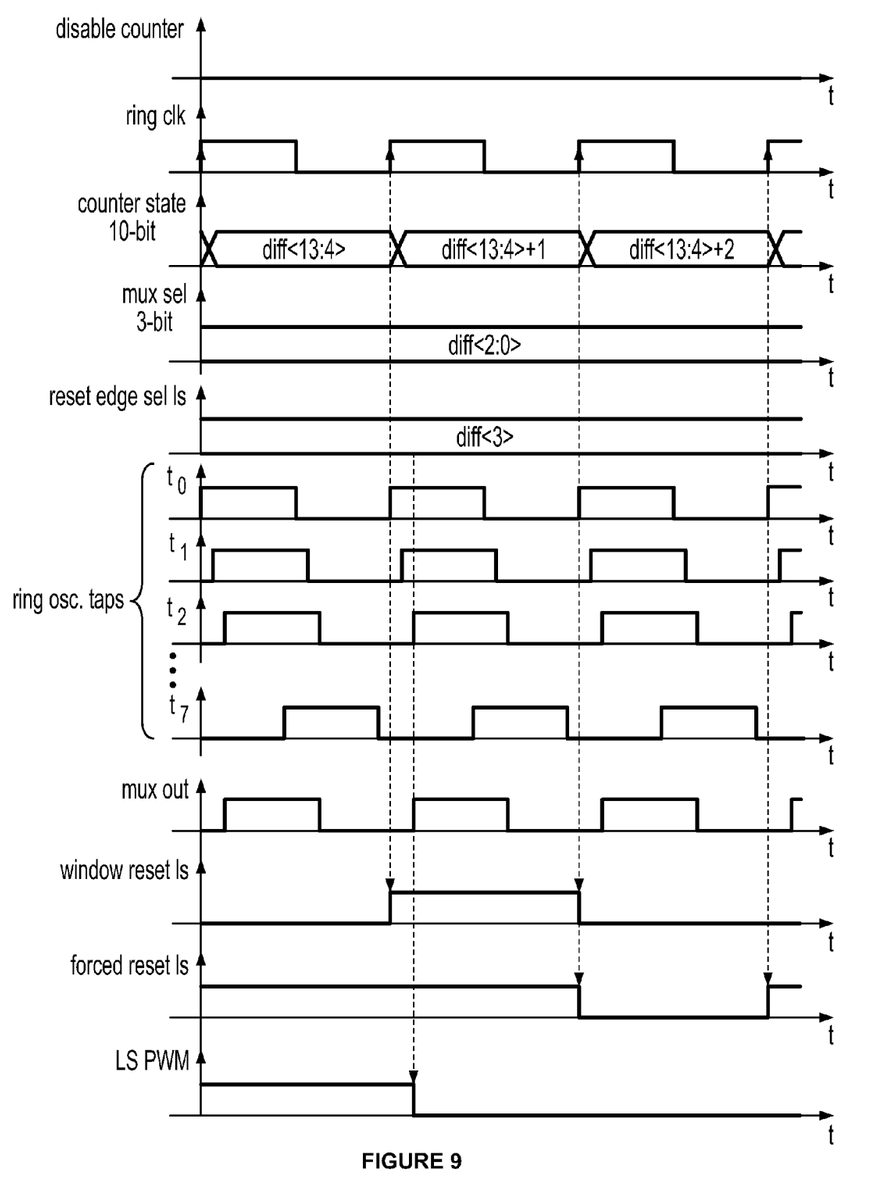
FIG. 9 shows a timing waveform sequence used to reset the low-side PWM signal.

The falling-edge generation of LS PWM is illustrated in FIG. 9. The operation of the DPWM FSM 116 in this state is similar to the case explained above for the reset HS PWM. The reset point is now calculated as a difference of the following values:

$$\text{difference} = 16 \cdot \text{counter restart state} - 1 - \text{dead time } ls. \quad (5)$$

As a result, the falling edge of LS PWM is generated before the new rising edge of HS PWM. The time internal between two edges is proportional to the selected value for dead time hs input.

The modulator 100 from FIG. 1 in PWM mode requires very simple phase-synchronization between modulator channels that switch either at the same frequency or at the multiple of some other frequency. The synchronization is performed only once. After the synchronization is disabled the modulator channels remain synchronized due the periodic operation of the DPWM counter.

Figure 10:
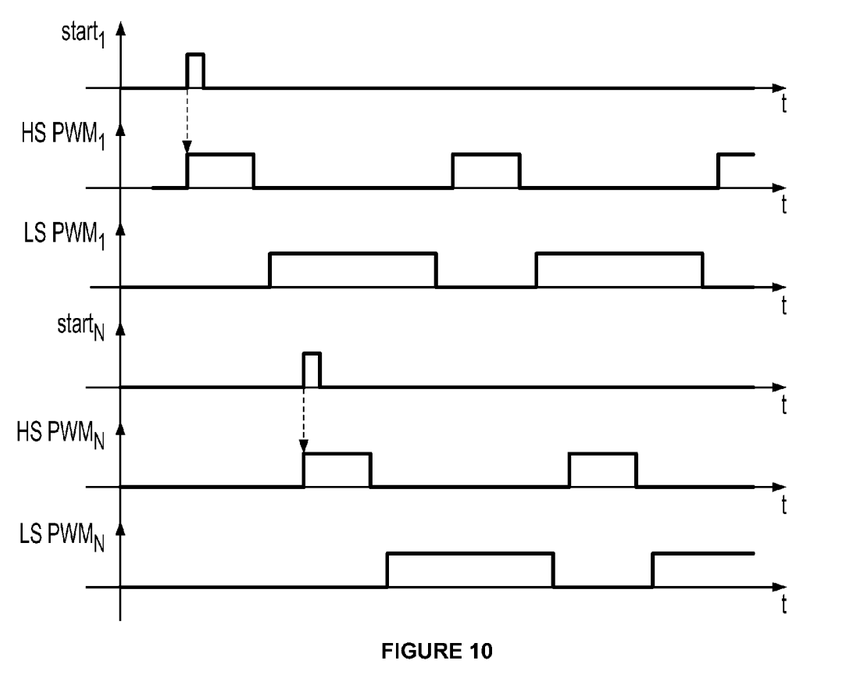
FIG. 10 shows a timing waveform for a one-time synchronization of switching signals between modulator channels.

At the beginning, the modulator channels are disabled using disable pwm channel input. As a result, disable counter is set to high causing the DPWM counter 114 and both HS PWM and LS PWM to be stuck at zero. When disable pwm channel changes its state to low, the DPWM counter does not start the periodic counting process until the rising edge of start input is received. Therefore, the synchronization between several channels is implemented by sending start pulses with the desired phase relationship between channels. The process is illustrated in FIG. 10. The phase relationship between channels can be accurately adjusted since it is always a multiple of the ring clk period.

In case the phase relationship needs to change "on-the-fly", the new start pulses are regenerated and the DPWM counters are restarted automatically with the new phase relationship.

When logic input pfm pwm mode sel becomes high, the modulator channel enters the pulse-frequency mode. In this mode outputs HS PWM and LS PWM are generated only when triggered by pfm comparator out. As a result, the pulse-frequency modulation of HS PWM and LS PWM is obtained. In PFM mode, the duty ratio input is used to control the generated pulse-on time. The dead-time generation also works in this mode as described before.

Figure 11:
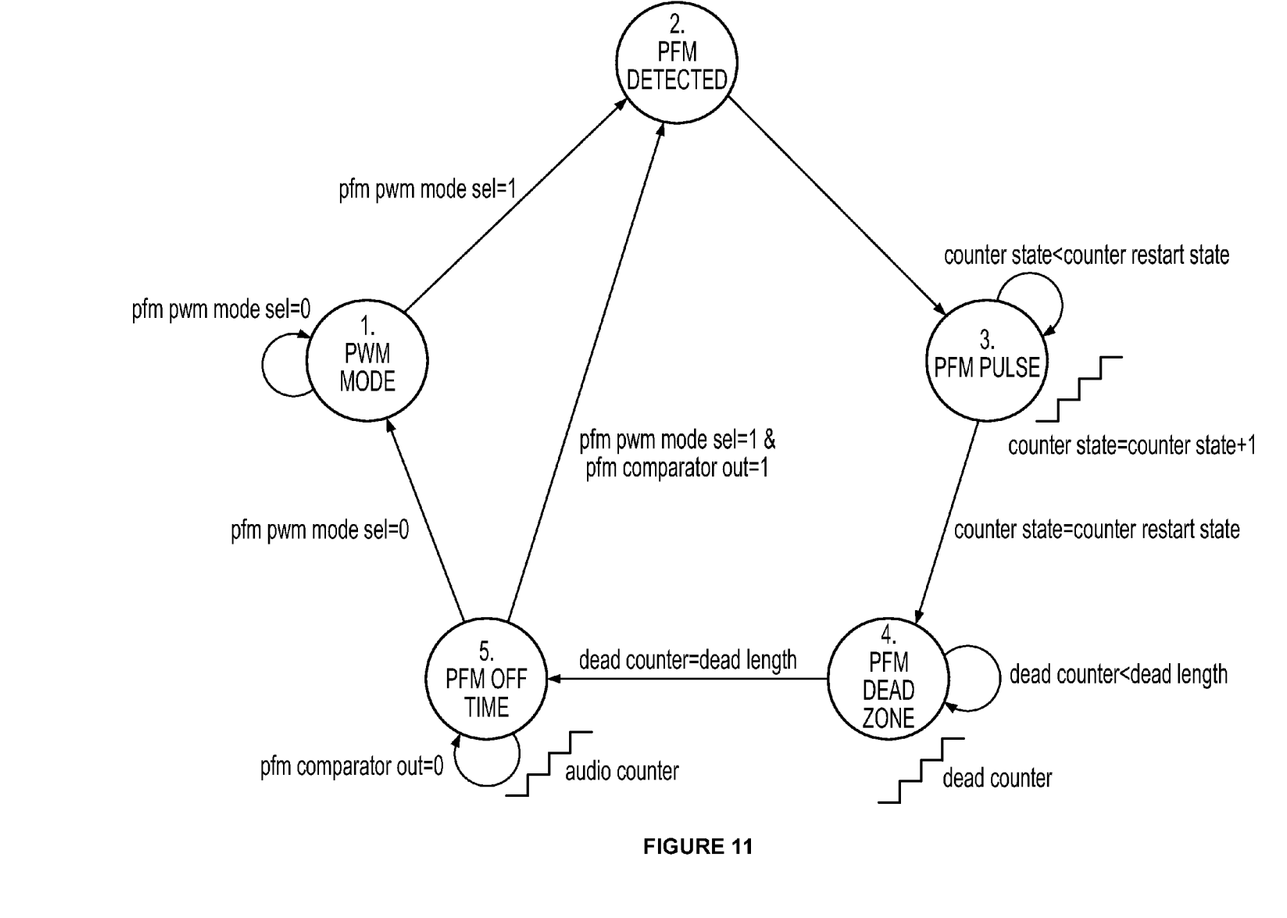
FIG. 11 shows a block diagram of a pulse frequency modulation (PFM) Finite-State Machine (FSM).
Figure 12:
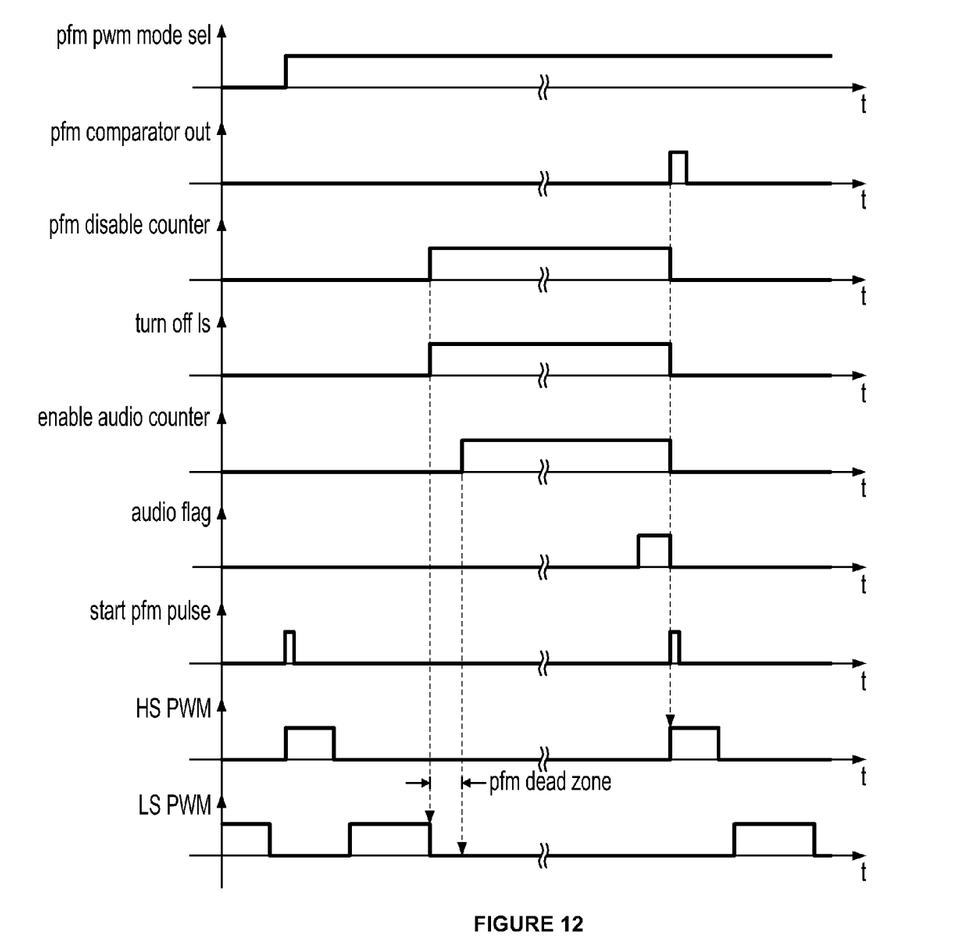
FIG. 12 shows a timing waveform for PFM mode of operation.

To avoid significant increase in the hardware complexity due to PFM mode capability, a simple PFM FSM block 120 is designed and added to each modulator channel. This logic block modifies the operation of the existing DPWM FSM 116 such that desired HS PWM and LS PWM are generated. The PFM FSM state-diagram is shown in FIG. 11. The timing diagram for a modulator channel that operates in the pulse-frequency mode is shown in FIG. 12.

Upon detecting a change in pfm pwm mode sel, the "PWM mode" state in PFM FSM 120 is exited and the state "PFM Detected" is entered. In this state, an audio flag is set to zero and pfm start pulse is generated. The audio flag serves as an indicator of low output pulse frequency. Based on this flag, an external circuit/module is allowed to change the modulator parameters and avoid operation in the audio frequency range.

In the following state, "PFM Pulse", the PFM FSM 120 enables the DPWM counter 114 by sending a start pfm pulse.

The DPWM FSM 116 recognizes the counter action and generates HS PWM and LS PWM as described in previous sections.

Once the counter reaches its maximum value, the PFM FSM 120 enters the state "PFM Dead Zone". Consequently, the PFM FSM 120 disables the DPWM counter 114 and starts an internal dead counter. At this point, both HS PWM and LS PWM are now turned off. In case pfm comparator out triggers the PFM FSM 120 immediately, the new PFM pulse is not generated until pfm dead zone time interval expires. In this way, the generated pulse frequency is guaranteed to be lower than the switching frequency in the PWM mode. This feature can be used to prevent the switching converter from operating with lower efficiency under certain load conditions. This event is detected based on the dead counter state.

Finally, when the dead zone generation is finished, the PFM FSM 120 waits for the next rising edge of pfm comparator out to produce a new PFM pulse. This state is named "PFM Off Time". The duration of the off time is monitored with the internal audio counter. This counter is clocked with a low-frequency clock signal obtained by dividing ring clk. If the off time is too large, the audio flag is set high as illustrated in FIG. 12.

The foregoing description of preferred embodiments of the present invention has been provided for the purposes of illustration and description. It is not intended to be exhaustive or to limit the invention to the precise forms disclosed. Many embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the claims and their equivalents.

The invention claimed is:

1. A circuit comprising:
multiple channels, each of the multiple channels being selectable to produce either a pulse width modulated signal or a pulse frequency modulated signal, the generation of the pulse width modulated signal or pulse frequency modulated signal being generated using a shared logic in each channel;
wherein the shared logic includes a counter that is used to produce the pulse frequency modulated signal and the pulse width modulated signal; and
wherein each of the channels includes a counter and wherein a single ring oscillator is used to produce a ring clock for each counter in the multiple channels.

2. The circuit of claim 1, wherein the multiple channels check to ensure any pulse frequency modulation (PFM) signal does not have too low or too high a frequency.

3. The circuit of claim 2, wherein the frequency and width of the PFM signal is adjusted if the frequency of the PFM signal is too low or too high.

4. A circuit comprising:
multiple channels to selectively produce pulse width modulation (PWM) signals or pulse frequency modulation (PFM) signals; and
a single ring oscillator that is shared by the multiple channels, the ring oscillator being used to synchronize the multiple channels, the single ring oscillator having taps that are used to provide for least significant bit (LSB) resolution for the PWM signals created by the multiple channels.

5. The circuit of claim 4, wherein the single ring oscillator synchronizes the multiple channels using a ring clock.

6. The circuit of claim 4, wherein the ring oscillator taps go into a multiplexor that selects a signal for pulse logic.

7. The circuit of claim 6, wherein the pulse logic is selectable to be triggered on the rising or falling of the selected signal.

8. The circuit of claim 4, wherein the multiple channels produce a high side and a low side PWM (or PFM) signal.

9. The circuit of claim 8, wherein the multiple channels produce the high side and low side PWM (or PFM) signals such that there is deadtime when neither the high side nor the low side PWM (or PFM) signal is high to prevent high side and low side switches from being on the same time.

10. The circuit of claim 9, wherein the deadtime at the rising and falling edge of the high side PWM (or PFM) signal are independently selectable.

11. The circuit of claim 4, wherein each of the channels has shared logic that is used for both pulse width modulation signal generation and pulse frequency modulation signal generation.

12. The circuit of claim 4, wherein the multiple channels check to ensure any pulse frequency modulation (PFM) signal does not have too low or too high a frequency.

13. The circuit of claim 4, wherein a frequency of each of the multiple channels is independently selectable.

14. A circuit comprising:
multiple channels, each channel selectable to produce a high side and a low side pulse width modulation (PWM) signals or high side and a low side pulse frequency modulation (PWM) signals, the high side and low side PWM signals and high side and a low side pulse frequency modulation (PFM) signals being created with a deadtime when neither the high side nor low side PWM (or PFM) signal is high to prevent a low side and a high side switches from being on at the same time; and
wherein deadtimes at the rising and falling edge of the high side PWM (or PFM) signal are independently selectable.

15. The circuit of claim 14, further comprising a single ring oscillator shared by the multiple channels, the ring oscillator being used to synchronize the multiple channels, the single ring oscillator having taps that are used to provide for least significant bit (LSB) resolution for the PWM signals created by multiple channels.

16. The circuit of claim 15, wherein the single ring oscillator synchronizes the multiple channels using a ring clock.

17. The circuit of claim 16, wherein the ring oscillator taps go into a multiplexer that selects a signal for pulse logic.

18. The circuit of claim 17, wherein the pulse logic is selectable to be triggered on the rising or falling edge of the selected signal.

* * * * *